United States Patent [19]
Hirota et al.

[11] Patent Number: 5,897,983
[45] Date of Patent: Apr. 27, 1999

[54] METHOD FOR FORMING A CAPACITOR IN A MEMORY CELL IN A DYNAMIC RANDOM ACCESS MEMORY DEVICE

[75] Inventors: Toshiyuki Hirota; Tomomi Kurokawa; Masanobu Zenke; Kazuki Yokota, all of Tokyo, Japan

[73] Assignee: NEC Corporation, Tokyo, Japan

[21] Appl. No.: 08/655,568

[22] Filed: May 30, 1996

[30] Foreign Application Priority Data

May 31, 1995 [JP] Japan ..................................... 7-156987

[51] Int. Cl.$^6$ ....................................................... G03C 5/00
[52] U.S. Cl. ........................................... 430/317; 430/313
[58] Field of Search ................................... 430/313, 317, 430/319, 5

[56] References Cited

U.S. PATENT DOCUMENTS

| 4,714,668 | 12/1987 | Uneno et al. | 430/317 |
| 5,132,240 | 7/1992 | Shimomura et al. | 437/52 |
| 5,620,918 | 4/1997 | Kondoh | 438/396 |

FOREIGN PATENT DOCUMENTS 05347392  12/1993  Japan .

*Primary Examiner*—Maria Nuzzolillo
*Assistant Examiner*—Laura Weiner
*Attorney, Agent, or Firm*—Young & Thompson

[57] ABSTRACT

In a method for forming an annular-shaped and vertically extending bottom electrode of a memory cell capacitor, a conductive film is formed on an inter-layer insulator. A photo-resist material is applied on the conductive film to form a photo-resist film thereon. The photo-resist film is patterned by a photo-lithography using a mask which includes a transparent plate-like body and a phase shifting film selectively provided on a predetermined region of the transparent plate-like body to form an annular-shaped and vertically extending photo-resist pattern over the conductive film. The conductive film is subjected to an anisotropic etching, in which the annular-shaped and vertically extending photo-resist pattern is used as a mask, to form an annular-shaped and vertically extending bottom electrode under the annular-shaped and vertically extending photo-resist pattern. The annular-shaped and vertically extending photo-resist pattern is removed.

8 Claims, 16 Drawing Sheets

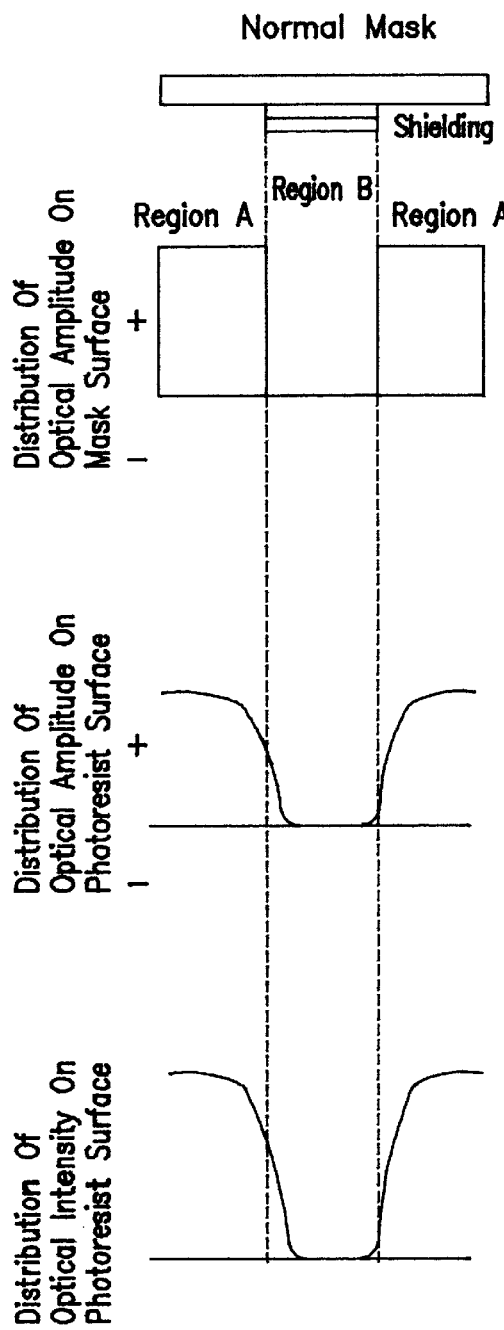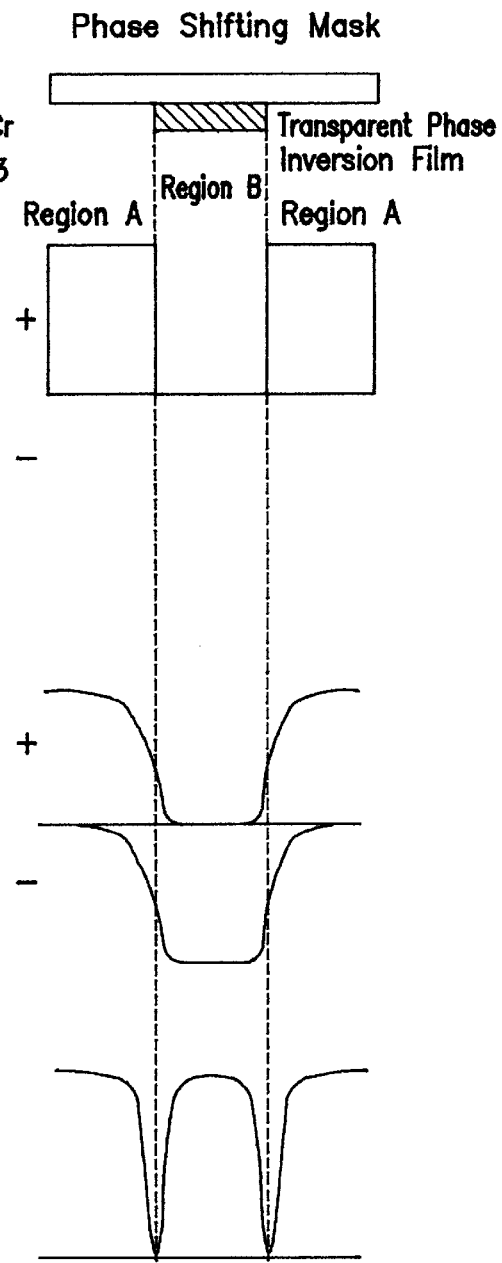

METHOD FOR FORMING A CAPACITOR IN A MEMORY CELL IN A DYNAMIC RANDOM ACCESS MEMORY DEVICE

BACKGROUND OF THE INVENTION

The present invention relates to a method for forming a capacitor in a memory cell in a dynamic random access memory.

Requirements for improvements in the integration of dynamic random access memory including a large number of memory cells, each of which comprises a pair of a transistor and a capacitor, have increased. In order to satisfy this requirement, it is required to further reduce an occupying area of each unit cell. The reduction in occupying area of each unit cell further requires a reduction in a horizontal area of the capacitor in the unit memory cell.

On the other hand, a sufficiently large capacitance of the memory cell is also necessary to provide the memory cell with a sufficient resistivity to soft errors caused by noise charges which are generated by alpha particles. The capacitance of the memory cell is proportional to an area of a dielectric film sandwiched between top and bottom electrodes which constitute the capacitor in the unit memory cell. The increase in capacitance of the memory cell requires an increase in area of the dielectric film sandwiched between the top and bottom electrodes. As described above, it is also required to reduce the horizontal area of the capacitor.

In the above circumstances, the issue with a design for the capacitor in the unit memory cell is how to reduce the horizontal area of the capacitor and enlarge the area of the dielectric film of the capacitor. It was proposed to form a vertically extending bottom electrode, for example, a cylindrically shaped bottom electrode in order to increase in the area of the dielectric film between the top and bottom electrodes of the capacitor in the memory cell. This proposals are disclosed in the Japanese laid-open patent applications Nos. 3-214668, 4-99373, 4-264767, and 3-232271.

A typical conventional method for forming a capacitor with a cylindrically shaped bottom electrode in the unit memory cell in the dynamic random access memory device will be described with reference to FIGS. 1A–1H.

With reference to FIG. 1A, field oxide films 2 are selectively formed in a surface region of a semiconductor substrate 1 to define an active region. A gate oxide film and a gate electrode 5 are selectively formed on a channel region in the active region defined by the field oxide films 2. Source and drain regions 3 and 4 are selectively formed in the surface region of the semiconductor substrate 1 to sandwich the channel region under the gate electrode 5. A first inter-layer insulator 6 is formed on an entire surface of the device to embed the gate electrode 5. A bit line through hole is selectively formed in the first inter-layer insulator 6 so that the bit line through hole overlies the drain region 4. A bit line plug is formed within the bit line through hole to plug up the bit line through hole and further bit lines 7 are formed on the first inter-layer insulator 6. A second inter-layer insulator 8 is formed on an entire surface of the device to embed the bit lines 7. A silicon nitride film 10 is formed on the second inter-layer insulator 8. A photo-resist film 11 is formed on the silicon nitride film 10. The photo-resist film 11 is patterned to have an opening over the source region 3. The silicon nitride film 10 is formed with an opening which lies under the opening of the photo-resist film 11. The silicon nitride film 10 is used as a mask to form a contact hole 9, which penetrates through the second inter-layer insulator 8, the bit lines 7 and the first inter-layer insulator 6, over the source region 3 so that the surface of the source region 3 is partially exposed.

With reference to FIG. 1B, after removal of the photo-resist pattern 11, a first silicon film 12 is formed both on the silicon nitride film 10 and within the contact hole 9 to plug up the same. The first silicon film 12 is doped with an impurity to increase a conductivity thereof.

With reference to FIG. 1C, a silicon oxide film 14 is formed on the first silicon film 12 by a chemical vapor deposition method. A photo-resist film is formed on the silicon oxide film 14 and then patterned to form a photo-resist pattern 13 which overlies the silicon oxide film 14. The center of the photo-resist pattern 13 is aligned to the center of the contact hole. The horizontal size of the photo-resist pattern 13 is larger than the horizontal size of the contact hole.

With reference to FIG. 1D, the photo-resist pattern 13 is used as a mask to selectively etch the silicon oxide film 14 and the first silicon film 12 so that the silicon oxide film 14 and the first silicon film 12 remain only under the photo-resist pattern 13 and over the contact hole 9 and peripheral areas of the contact hole 9. Thereafter, the photo-resist pattern 13 is removed.

With reference to FIG. 1E, a second silicon film 15 having a thickness in the range of 100 nanometers to 200 nanometers is formed on an entire surface of the device to extend over the silicon nitride film 10 and on vertical side walls of the first silicon film 12 and the silicon oxide film 14 as well as on the top surface of the silicon oxide film 14. As a result, the silicon oxide film 14 is surrounded by the first and second silicon oxide films 12 and 15.

With reference to FIG. 1F, the second silicon film 15 is then subjected to an etch-back so as to leave only vertical portions of the second silicon film 15 extending on the vertical surfaces of the first silicon film 12 and the silicon oxide film 14.

With reference to FIG. 1G, the silicon oxide film 14 is etched by fluorine acid to thereby form a bottom electrode which comprises the vertical portions of the second silicon film 15 and the horizontal portion of the first silicon film 12.

With reference to FIG. 1H, a dielectric film 16 is formed on an entire surface of the device to extend on the silicon nitride film 10 and on outer vertical side wall of the second silicon film 15 of the bottom electrode as well as on the top of the second silicon film 15 and inner vertical side wall of the second silicon film 15, in addition the top of the first silicon film 12, to thereby cover an entire surface of the bottom electrode. A top electrode 17 is formed on an entire surface of the dielectric film 16, to thereby form a capacitor for the memory cell in the dynamic random access memory.

As described above, the conventional processes for forming the memory cell capacitor are complicated. The reasons for such complicated processes for forming the memory cell capacitor are as follows. First, it is difficult to define a fine pattern for the cylindrically shaped bottom electrode by use of the normal photo-lithography since the size of the fine pattern is smaller than a resolving power of the reduced exposure. Second, if an annular pattern is formed and subsequently an etching is carried out, then a disconnection from a contact plug will appear due to the etching process.

The above conventional processes for forming the memory cell capacitor are so complicated as to include two formations of the silicon films, two anisotropic dry etching processes, one wet etching process. Such complication of the processes for forming the memory cell capacitor of increases in the cost thereof and decrease the in yield of the products due to residue and particles generated by the etching processes.

SUMMARY OF THE INVENTION

Accordingly, it is an object of the present invention to provide a novel method for forming a cylindrical shaped memory cell capacitor, which is free from the above problems.

The above and other objects, features and advantages of the present invention will be apparent from the following description.

The present invention provides a novel method for forming an annular-shaped and vertically extending bottom electrode of a memory cell capacitor, comprising the following steps. A conductive film is formed on an inter-layer insulator. A photo-resist material is applied on the conductive film to form a photo-resist film thereon. The photo-resist film is patterned by a photo-lithography using a mask which comprises a transparent plate-like body and a phase shifting film being selectively provided on a predetermined region of the transparent plate-like body to thereby form an annular-shaped and vertically extending photo-resist pattern over the conductive film. The conductive film is subjected to an anisotropic etching, in which the annularshaped and vertically extending photo-resist pattern is used as a mask, to form an annular-shaped and vertically extending bottom electrode under the annular-shaped and vertically extending photo-resist pattern. The annularshaped and vertically extending photo-resist pattern is removed.

BRIEF DESCRIPTIONS OF THE DRAWINGS

Preferred embodiments of the present invention will be described in detail with reference to the accompanying drawings.

FIGS. 3A and 3B are views illustrative of differences in distributions of optical intensity and amplitude on photo-resist surfaces as well as in distributions of optical amplitude on a mask surface between when using normal mask and phase shifting mask.

DESCRIPTION OF THE PREFERRED EMBODIMENTS

Figure 1A:
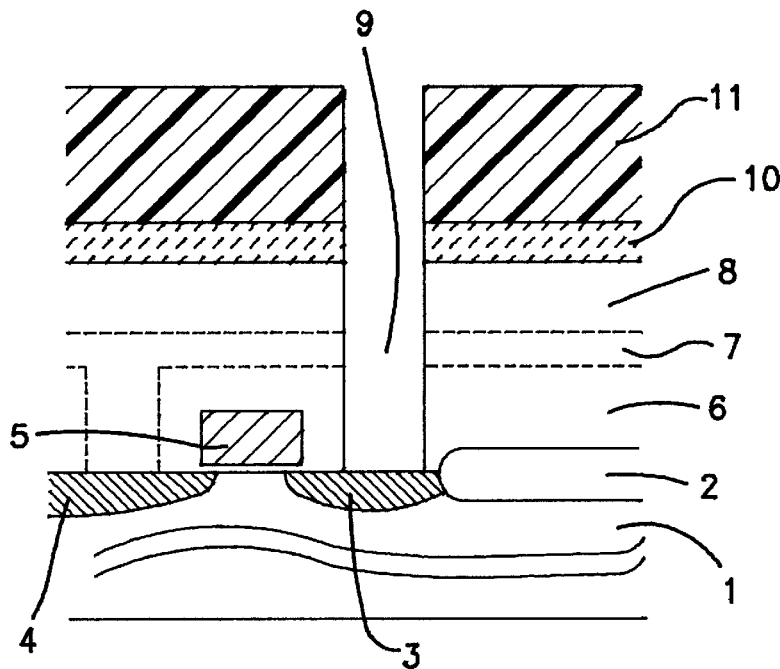
FIGS. 1A through 1H are fragmentary cross sectional elevation views illustrative of memory cell capacitors involved in the conventional method for forming the same.
Figure 1B:
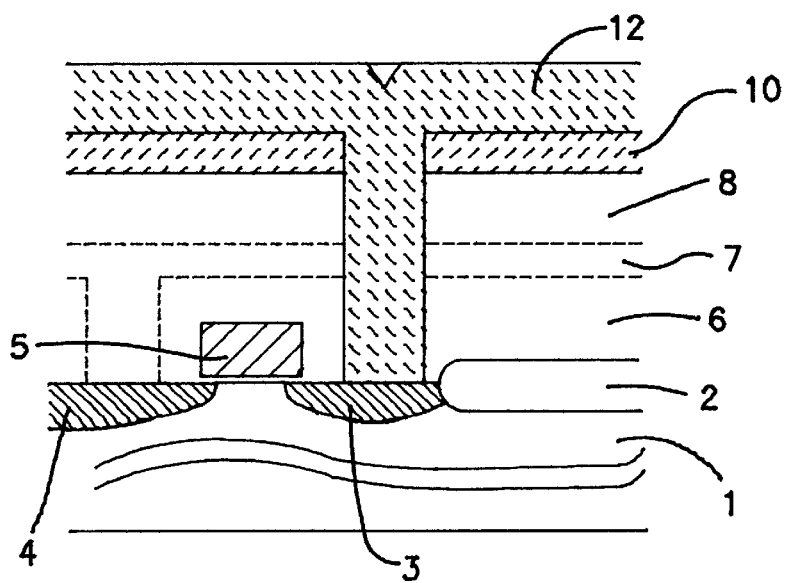
Figure 1C:
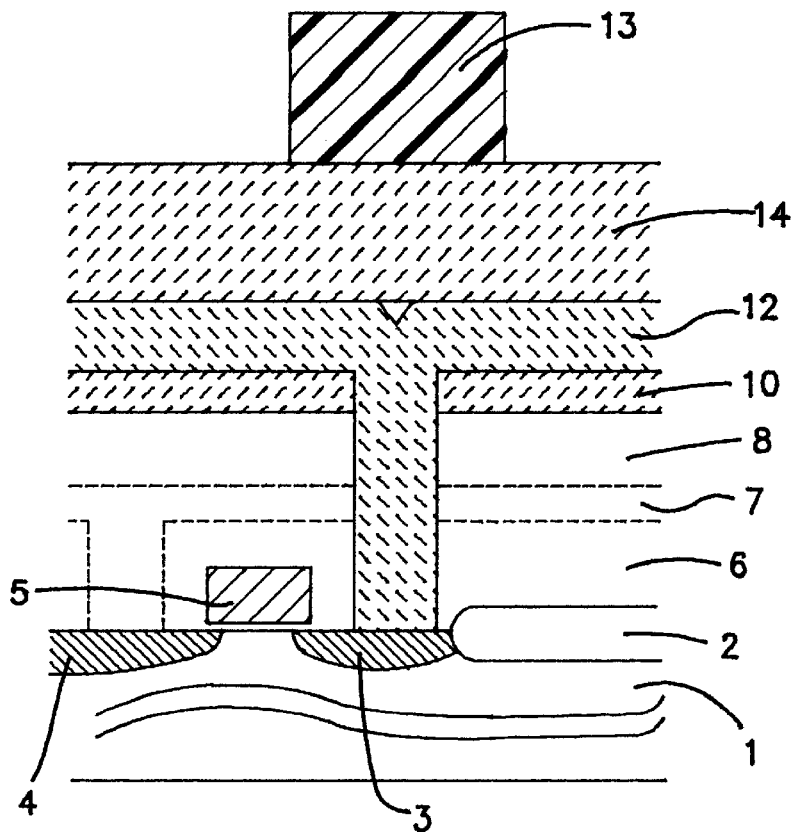
Figure 1D:
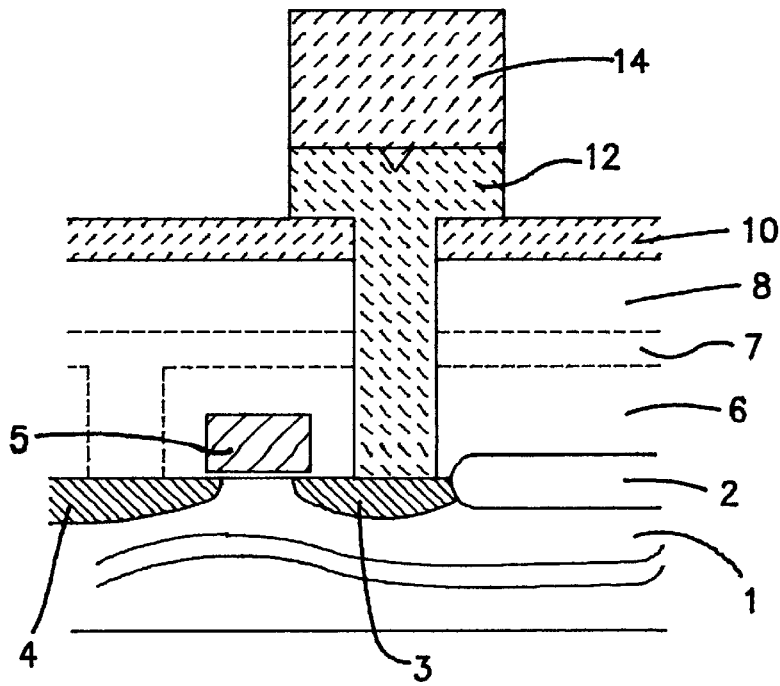
Figure 1E:
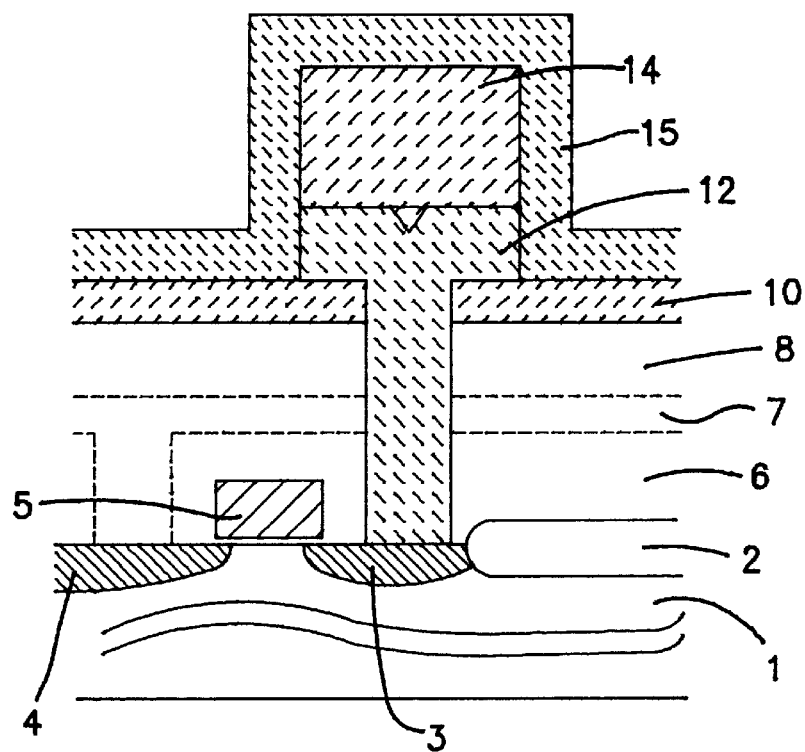
Figure 1F:
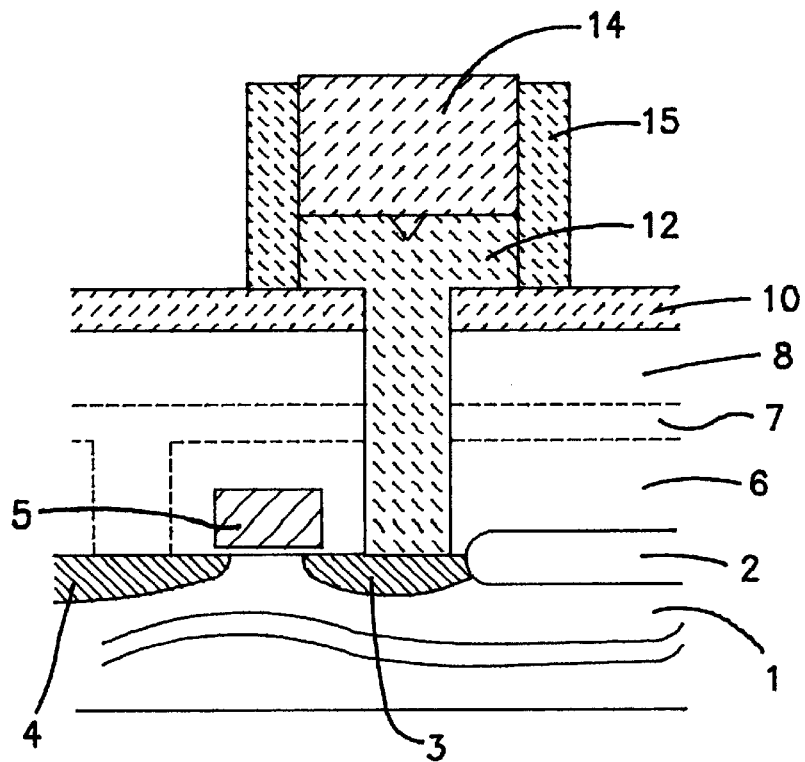
Figure 1G:
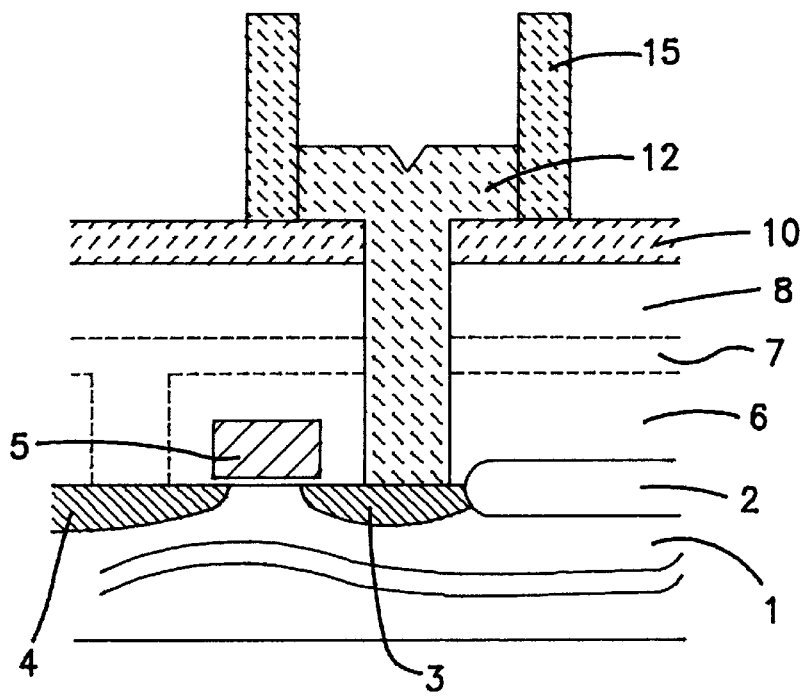
Figure 1H:
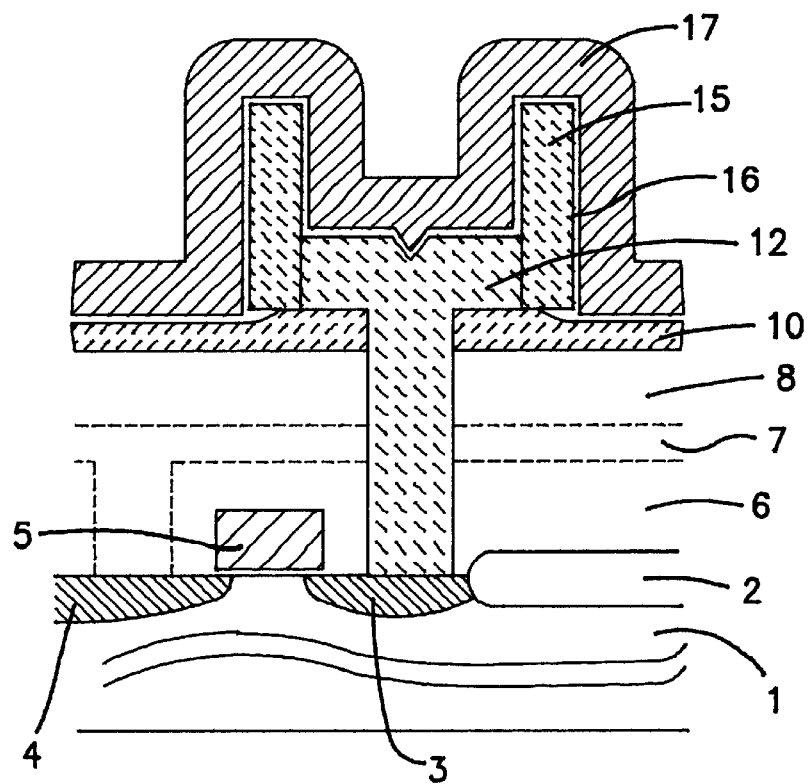

The present invention provides a novel method for forming an annular-shaped and vertically extending bottom electrode of a memory cell capacitor, comprising the following steps. A conductive film is formed on an inter-layer insulator. A photo-resist material is applied on the conductive film to form a photo-resist film thereon. The photo-resist film is patterned by a photo-lithography using a mask which comprises a transparent plate-like body and a phase shifting film being selectively provided on a predetermined region of the transparent plate-like body to thereby form an annular-shaped and vertically extending photo-resist pattern over the conductive film. The conductive film is subjected to an anisotropic etching, in which the annular-shaped and vertically extending photo-resist pattern is used as a mask, to form an annular-shaped and vertically extending bottom electrode under the annular-shaped and vertically extending photo-resist pattern. The annular-shaped and vertically extending photo-resist pattern is removed.

The present invention also provides a method for forming a memory cell capacitor, comprising the following steps. A first photo-resist film having an opening is applied on an inter-layer insulator. The inter-layer insulator is subjected to an anisotropic wet etching, in which the first photor-esist film is used as a mask, to form a bowl-like recess in an upper region of the inter-layer insulator. The inter-layer insulator is subjected to an isotropic dry etching, in which the first photo-resist film is used as a mask, to form a vertically extending pillar-like hole downwardly extending from the bowl-like recess and having a smaller diameter than a diameter of the bowl-like recess to thereby form a contact hole comprising the bowl-like recess and the vertically extending pillar-like hole. The first photo-resist film is removed. A conductive film is formed, which both plugs up the contact hole and extends over the inter-layer insulator. A photo-resist material is applied on the conductive film to form a photo-resist film thereon. The photo-resist film is patterned by a photo-lithography using a mask which comprises a transparent plate-like body and a phase shifting film being selectively provided on a predetermined region of the transparent plate-like body to form an annular-shaped and vertically extending photo-resist pattern over the conductive film. The annular-shaped and vertically extending photo-resist pattern has an outer vertical surface being positioned outside an peripheral edge of the bowl-like recess in plane view as well as has an inner vertical surface being positioned inside the peripheral edge of the bowl-like recess and outside an peripheral edge of the vertically extending pillar-like hole in plane view. The conductive film is subjected to an anisotropic etching, in which the annular-shaped and vertically extending photo-resist pattern is used as a mask, to form a bottom electrode which comprises an annular-shaped and vertically extending portion under the annular-shaped and vertically extending photo-resist pattern, a bowl-like portion with a concave received in the bowl-like recess and a vertically extending pillar-like portion. The annular-shaped and vertically extending portion has an outer vertical surface being positioned outside an peripheral edge of the bowl-like recess in plane view as well as has an inner vertical surface being positioned inside the peripheral edge of the bowl-like recess and outside an peripheral edge of the vertically extending pillar-like hole in plane view. The annular-shaped and vertically extending photo-resist pattern is removed. A dielectric film is formed, which extends on an entire surface of the annular-shaped and vertically extending portion of the bottom electrode as well as on a top surface of the inter-layer insulator. A second conductive film is formed on an entire surface of the dielectric film to form a top electrode.

The present invention also provides another method for forming a memory cell capacitor, comprising the following steps. A first photo-resist film having an opening is formed on an inter-layer insulator. The inter-layer insulator is subjected to an isotropic dry etching, in which the first photo-resist film is used as a mask, to form a vertically extending pillar-like hole to thereby form a contact hole comprising the vertically extending pillar-like hole. The first photo-resist film is removed. A conductive film is formed, which both plugs up the contact hole and extends over the inter-layer insulator. A photo-resist material is applied on the conductive film to form a photo-resist film thereon. The photo-resist film is patterned by a photo-lithography using a mask which comprises a transparent plate-like body and a phase shifting film being selectively provided on a predetermined region of the transparent plate-like body to form an annular-shaped and vertically extending photo-resist pattern over the conductive film. The annular-shaped and vertically extending photo-resist pattern has a part being positioned over the vertically extending pillar-like hole. The conductive film is subjected to an anisotropic etching, in which the annular-shaped and vertically extending photo-resist pattern is used as a mask, to form a bottom electrode which comprises an annular-shaped and vertically extending portion under the annular-shaped and vertically extending photo-resist pattern and a vertically extending pillar-like portion. The annular-shaped and vertically extending portion has a part from which the vertically extending pillar-like portion extends downwardly. The annular-shaped and vertically extending photo-resist pattern is removed. A dielectric film is formed, which extends on an entire surface of the annular-shaped and vertically extending portion of the bottom electrode as well as on a top surface of the inter-layer insulator. A second conductive film is formed on an entire surface of the dielectric film to form a top electrode.

In the alternative embodiments the photo-resist film may be a positive photo-resist film, the annular-shaped and vertically extending photo-resist pattern may be a cylindrical shape, and the conductive film may be a silicon film doped with an impurity.

In further embodiments the photo-lithography may be carried out by use of a light having a wavelength of 365 nanometers, the mask may have a size of 1.3 micrometers× 0.5 micrometers, and the phase shifting film may have width of 0.35 micrometers.

Alternatively the photo-lithography may be carried out by use of a light having a wavelength of 248 nanometers, the mask may have; a size of 0.7 micrometers×0.35 micrometers and the phase shifting film has a width of 0.25 micrometers.

The above novel processes for forming the memory cell capacitor are so simple as to include a single formation of the silicon film, one time single anisotropic dry etching process, and a single wet etching process. Such simple processes for forming the memory cell capacitor can solve the issues of the increase in the cost as well as the; decrease in yield of the products due to residue and particles generated by the etching processes.

A first embodiment according to the present invention will be described in detail with reference to FIGS. 2A through 2E, 3 and 4, wherein a novel method for forming a cylindrically shaped capacitor in each memory cell in a 64M-dynamic random access memory.

Figure 2A:
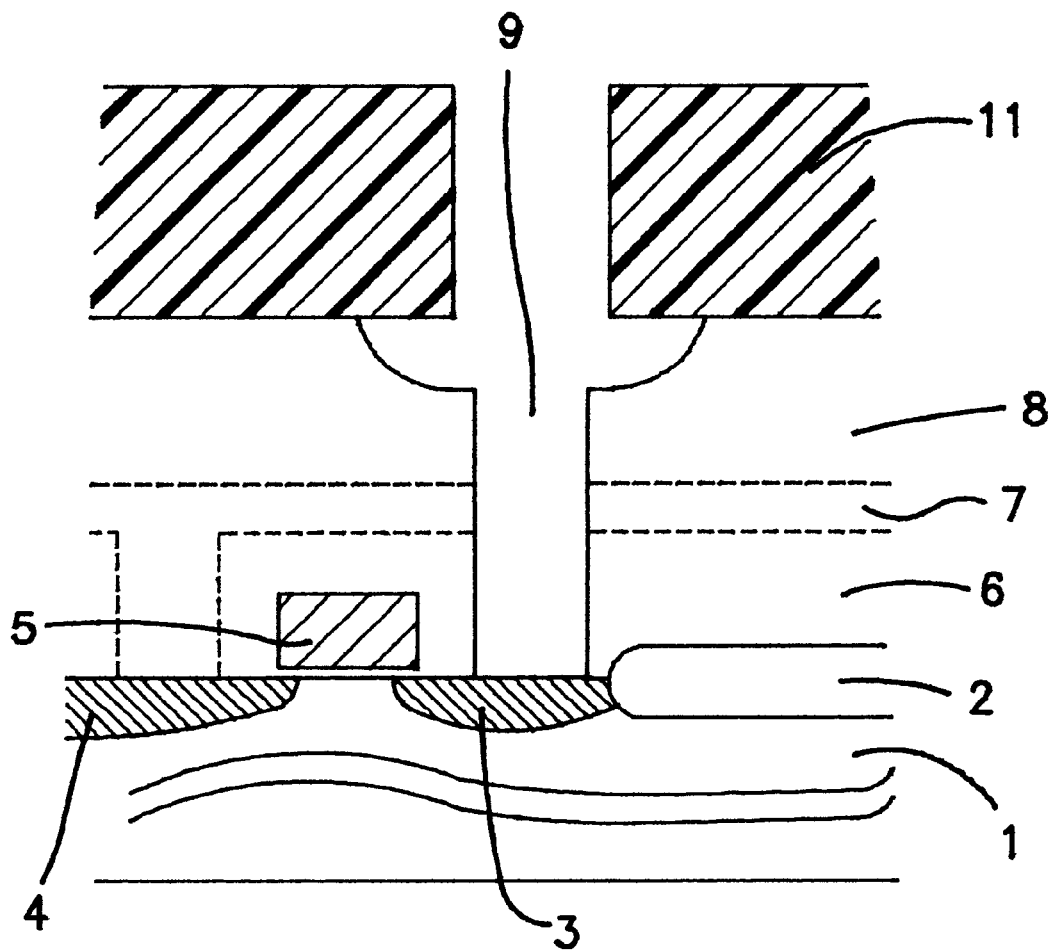
FIGS. 2A through 2E are fragmentary cross sectional elevation views illustrative of memory cell capacitors involved in a novel method for forming the same in a first embodiment according to the present invention.

With reference to FIG. 2A, field oxide films 2 are selectively formed by a local oxidation of silicon in a surface region of a semiconductor substrate 1 to define an active region surrounded by the field oxide films 2. A gate oxide film and a gate electrode 5 are selectively formed on a part of the active region. Source and drain regions 3 and 4 are selectively formed, for example, by self-alignment technique using the gate electrode as a mask so that the source and drain regions 3 and 4 sandwich a channel region under the gate electrode 5. In order to isolate the gate electrode 5, a first high temperature oxide film and a boron phosphate silicate glass film are in turn formed on an entire surface of the device and thus subjected to an annealing at a temperature in the range of 750° C. to 900° C. to cause a reflow of the boron phosphate silicate glass material to thereby obtain a planer surface of the boron phosphate silicate glass film. As a result, a first inter-layer insulator 6 is formed, which covers the source and drain regions 3 and 4 as well as the field oxide films 2 in addition so as to embed the gate electrode 5. A through hole is formed in the first inter-layer insulator 6 over the drain region 4. A conductive film made of a refractory metal such as tungsten silicide WSi is deposited within the through hole and on the first inter-layer insulator 6. The conductive film is then patterned by a photo-lithography to form bit lines 7. A non-doped silicate glass film and a boron phosphate silicate glass film are formed by a chemical vapor deposition and then subjected to an annealing at a temperature in the range of 750° C. to 900° C. to cause a reflow the boron phosphate silicate glass material to thereby obtain a planer surface of the boron phosphate silicate glass film. Further, a non-doped silicate glass film having a thickness in the range of 100 nanometers to 300 nanometers by use of a chemical vapor deposition using silane gas ($SiH_4$) and oxygen ($O_2$) at a temperature in the range of 400° C. to 500° C. As a result, a second inter-layer insulator 8 is formed, which covers the bit lines 7 and the first inter-layer insulator 6. A photo-resist film is applied on an entire surface of the second inter-layer insulator 8 and then patterned by a photo-lithography to form a photo-resist pattern 11 having a hole which positioned over the source region 3. The second inter-layer insulator 8 is partially exposed through the hole of the photo-resist pattern 11. The photo-resist pattern 11 is used to subject the exposed part of the second inter-layer insulator 8 to an isotropic wet etching with fluorine acid to form a bowl like opening in the upper region of the second inter-layer insulator 8. Subsequently, an anisotropic etching is carried out to form a vertical opening to thereby form a contact hole 9, comprising the bowl-like opening and the vertical opening, under the bowl like opening, which penetrates the second inter-layer insulator 8, the bit line 7 and the first inter-layer insulator 6 so that a part of the source region 3 is exposed through the contact hole 9.

Figure 2B:
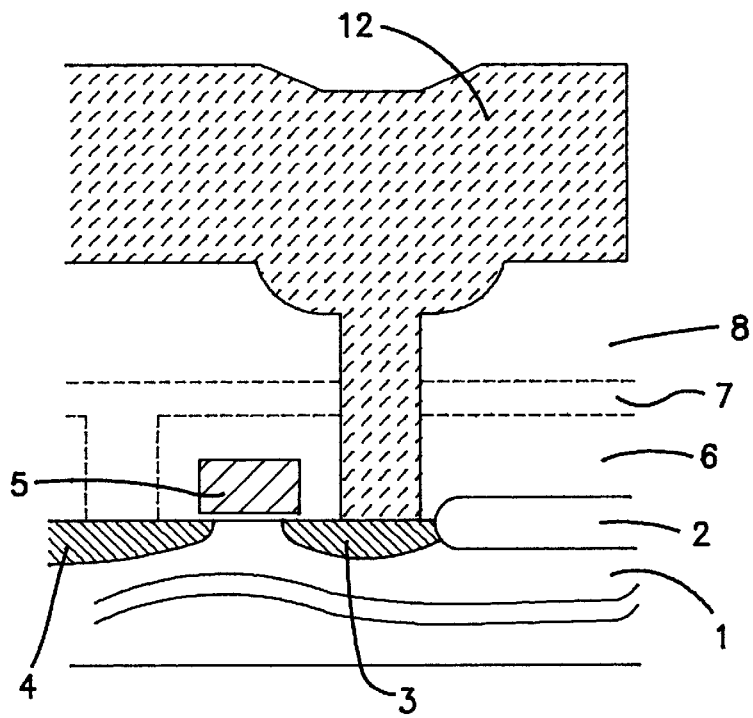
Figure 2C:
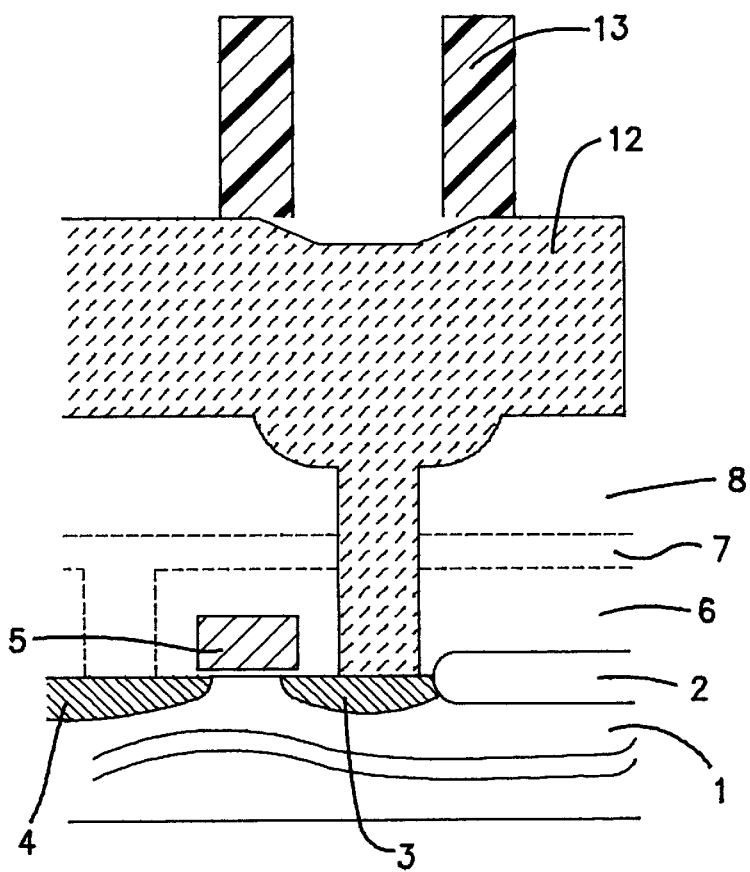

With reference to FIG. 2B, a low pressure chemical vapor deposition method is carried out using gas systems comprising phosphate and either silane or disilane to deposit a first silicon film 12 having a phosphorus concentration in the range of 0.5E20 atoms/cc to 1.0E20 atoms/cc and a thickness of 500 nanometers whereby the first silicon film 12 plugs up the contact hole 9 and extends on the second inter-layer insulator 8.

A positive photo-resist is applied on an entire surface of the device and then patterned by a photo-lithography using a phase shifting reticule as a mask. FIGS. 3A and 3B: illustrate optical intensity distributions on photo-resist surfaces when using the normal mask and the phase shifting mask as well as optical amplitude distributions on the photo-resist surfaces when using the normal mask and the phase shifting mask. In addition, FIGS. 3A and 3B illustrate the optical amplitude distributions on the mask surfaces when using the normal mask and the phase shifting mask. The normal mask is provided with an optical shielding film on a region B and the remaining region A is transparent to the light. The phase shifting mask is provided with a transparent phase shifting film on a region B and the remaining region A is also transparent to the light, but not provide any phase shifting. From FIG. 3, it could be understood that in the normal mask almost no light is transmitted on the region B whilst in the phase shifting mask a light is phase-shifted and transmitted on the region B. When the phase shifting mask is used, the lights transmitted on the regions A and B have reversed phases to each other. As a result, on the photo-resist surface at the boundary between the regions A and B. the lights having the reversed phases to each other are canceled by each other so that a dark part appears at the boundary between the regions A and B. This means that if the region A is shaped in a fine rectangle, circle or ellipse, then annular patterns near the shape of the region A appear on the photo-resist surface.

Figure 4:
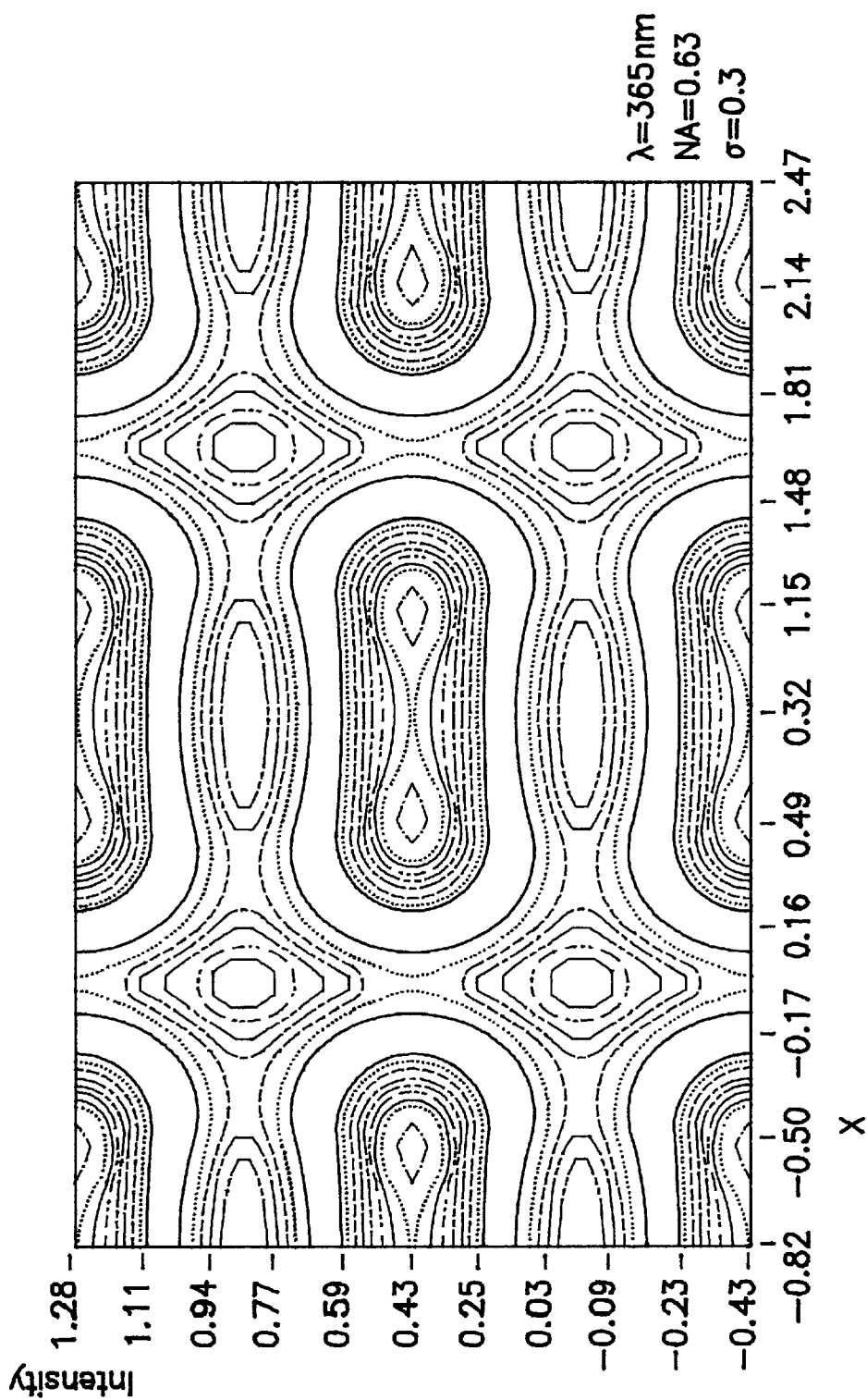
FIG. 4 is a view illustrative of a pattern of distribution of optical intensity on a photo-resist surface when a phase shifting mask is used in a first embodiment according to the present invention.
Figure 5A:
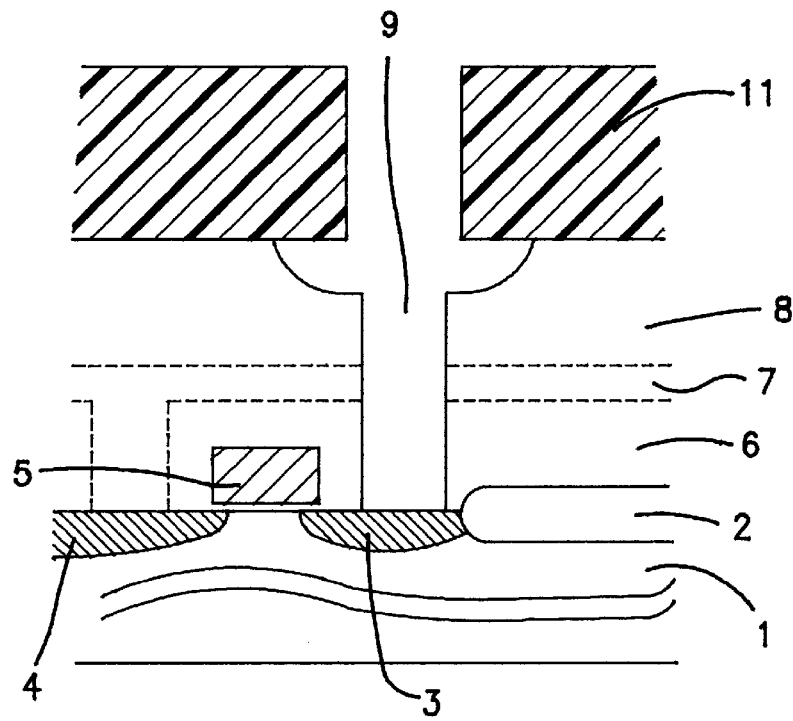
FIGS. 5A through 5E are fragmentary cross sectional elevation views illustrative of memory cell capacitors involved in a novel method for forming the same in a second embodiment according to the present invention.
Figure 5B:
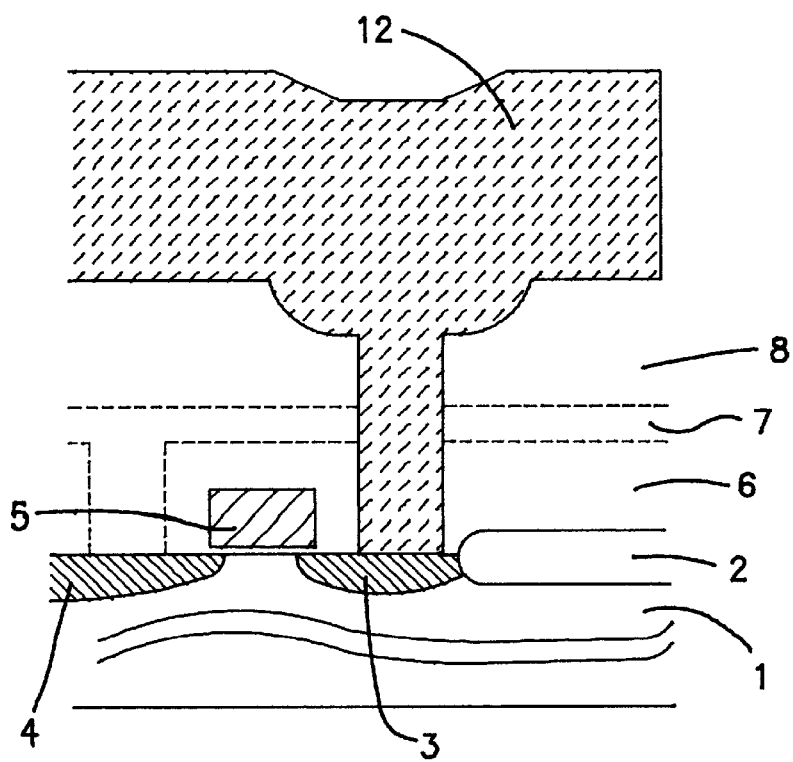
Figure 5C:
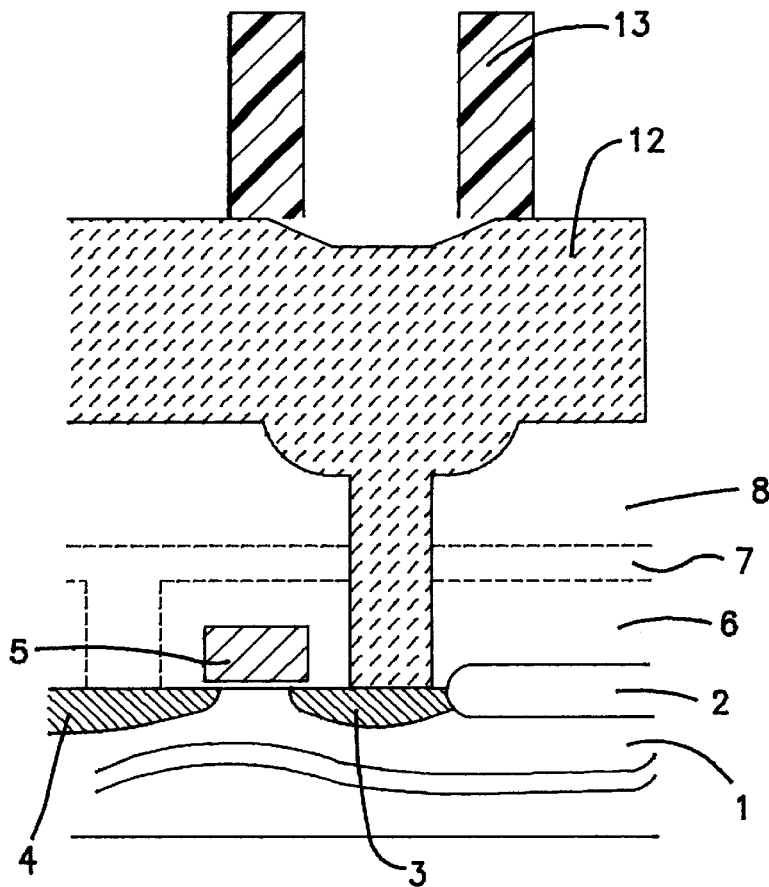
Figure 5D:
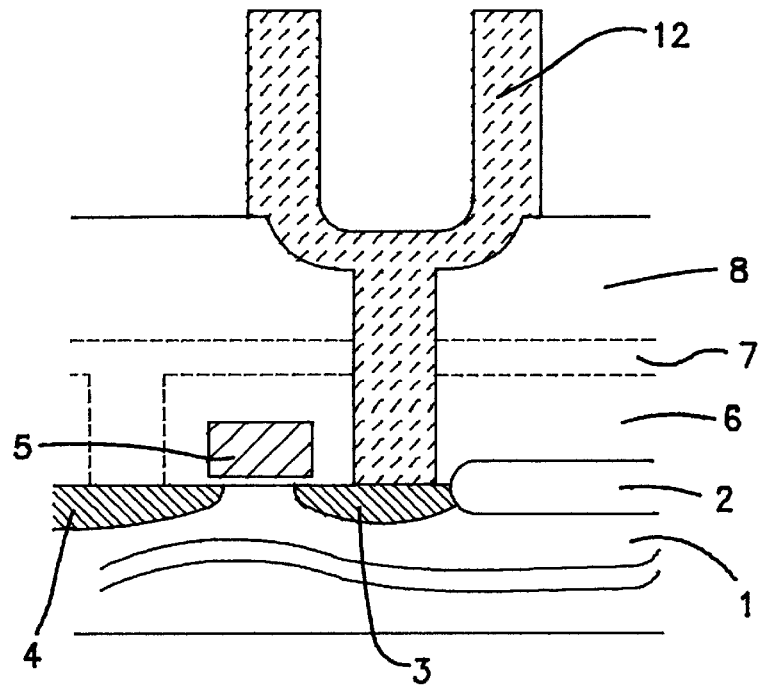
Figure 5E:
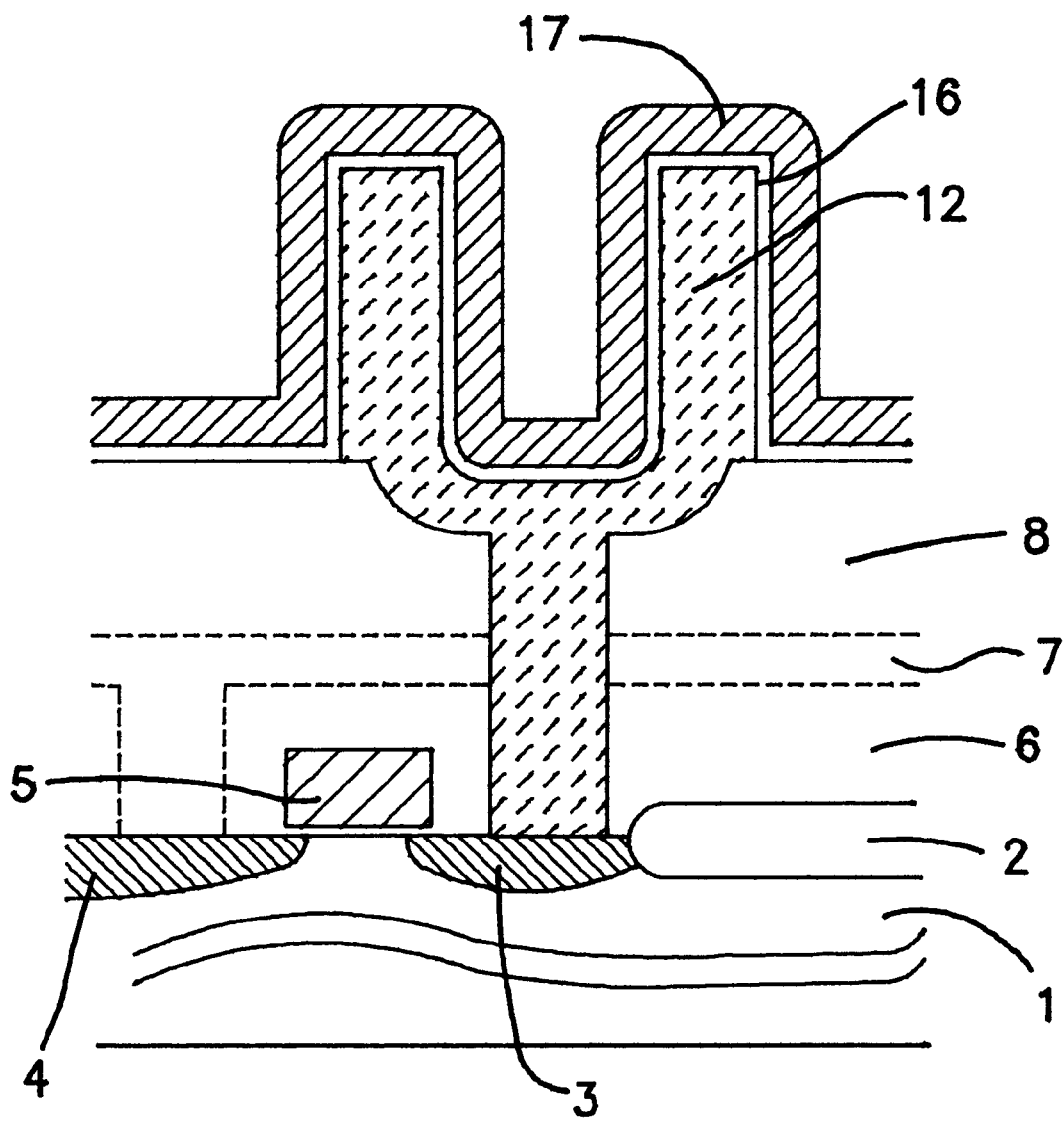

FIG. 4 illustrates the optical intensity distribution which appears on the photo-resist mask when the phase shifting reticule is a mask, wherein a light source for emitting an i-ray having a wavelength of 365 nanometers is used. The phase shifting mask is a mask having a size of 1.3 micrometers×0.5 micrometers and being provided with a phase shifting film having a width of 0.35 micrometers. The phase shifting film is provided on a region B and no phase shifting film is provided on the remaining region A. The number of openings NA is equal to 0.63. σ=0.3. Under those conditions, the photo-resist film is exposed to the photo-lithography. An exposure value is properly set so that a portion represented by real line is not sensitized. Thus, in subsequent development, of the positive photo-resist the portion represented by the real line remains.

With reference back to FIG. 2C, the photo-resist applied on the first silicon film 12 is exposed in the manner as described above and subsequently developed to form a photo-resist pattern 13 of a vertically extending wall being annular-shaped. The vertically extending wall of the photo-resist pattern 13 has an inner vertical surface which is positioned inside a peripheral end of the bowl-like portion of the first silicon film 12 and outside the peripheral end of the vertically extending portion of the first silicon film 12. The vertically extending wall of the photo-resist pattern 13 also has an outer vertical surface which is positioned outside the peripheral end of the bowl-like portion of the first silicon film 12.

Figure 2D:
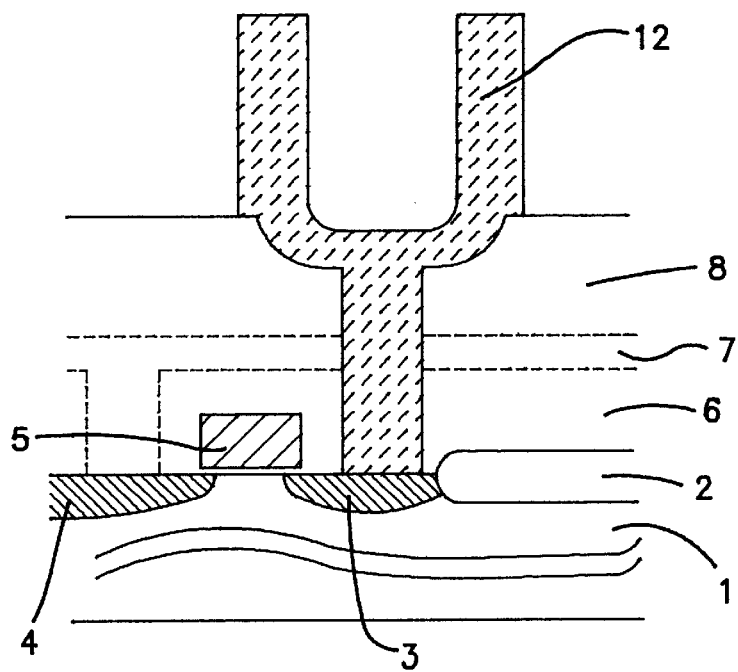

With reference to FIG. 2D, the photo-resist pattern 13 is used as a mask for an etching, for example, an anisotropic etching to selectively remove the first silicon film 12 to thereby form a bottom electrode that comprises a vertically extending portion within the vertical hole portion of the contact hole 9, a bowl-like portion with a recess within the bowl-like opening of the contact hole 9 and a vertically extending portion being that is annular-shaped under the photo-resist pattern 13. Of the bottom electrode 12, the vertically extending portion being annular-shaped has an inner vertical surface which is positioned to correspond to an outer end of the recess of the bowl-like portion and an outer vertical surface which is positioned outside the peripheral edge of the bowl-like portion. Thereafter, the photo-resist pattern 13 is removed. A spontaneous oxide film that coats surfaces of the bottom electrode 12 is removed using a diluted fluorine acid solution. In order to prevent any further spontaneous oxide film from being again formed, a rapid thermal nitriding is performed at a temperature in the range of 850° C. to 900° C. in an ammonia atmosphere for a time in the range of 30 seconds to 60 seconds.

Figure 2E:
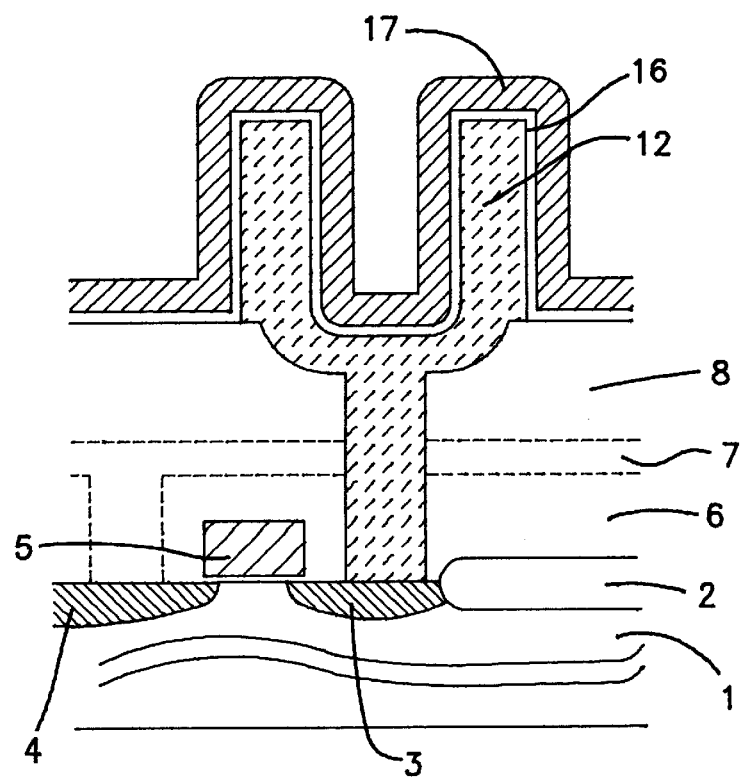

With reference to FIG. 2E, a silicon nitride film having a thickness in the range of 5 nanometers to 7 nanometers is grown, which extends on an entire surface of the bottom electrode 12 and on the second inter-layer insulator 8. The silicon nitride film is subjected to a pyrogenic oxidation in a steam atmosphere at a temperature in the range of 800° C. to 900° C. for ten minutes to 30 minutes to thereby from a $SiO_2/Si_3N_4$ dielectric film 16 which extends on an entire surface of the bottom electrode 12 and on the top surface of the second inter-layer insulator 8. A second silicon film 17 having a thickness of 150 nanometers is deposited on an entire surface of the $SiO_2/Si_3N_4$ dielectric film 16 by a low pressure chemical vapor deposition method. Phosphorus is introduced into the second silicon film 17 by a thermal diffusion at a temperature of 850° C. for a time in the range of ten minutes to fifteen minutes to form a top electrode 17. As a result, the memory capacitor is formed in the manner described above.

The above method for forming the memory cell capacitor may be applicable to the memory cell capacitor which is positioned below the bit line.

Alternatively, that the first silicon film free of any impurity may be previously formed in the same manner as described above and then the impurity such as phosphorus may be introduced thereinto in the same manner as introducing phosphorus into the second silicon film.

The second silicon film already doped with phosphorus may be deposited on the dielectric film.

The reason why the contact hole 9 is formed by the anisotropic wet etching in combination with subsequent isotropic dry etching to form the bowl-like opening portion is to ensure an enlarged margin the etching process used to form the vertically extending portion that is annular-shaped so as to prevent the depth of etching from reaching at the bottom of the bowl-like portion of the contact hole. This makes the bottom electrode 12 free from a possibility of disconnection of the vertically extending center portion from the vertically extending pillar portions thereof.

The above novel processes for forming the memory cell capacitor are so simple as to include a single formation of the silicon film, a single anisotropic dry etching process, and a single wet etching process. Such simple processes for forming the memory cell capacitor can solve the issues of the increase in the cost as well as the decrease in yield of the products due to residue and particles generated by the etching processes.

A second embodiment according to the present invention will be described in detail with reference to FIGS. 5A through 5E and 6.

With reference to FIG. 5A–5E, the second embodiment is the same as described in reference to FIGS. 2A–2E.

A positive photo-resist is applied on an entire surface of the device and then patterned by a photo-lithography using a phase shifting reticule as a mask.

Figure 6:
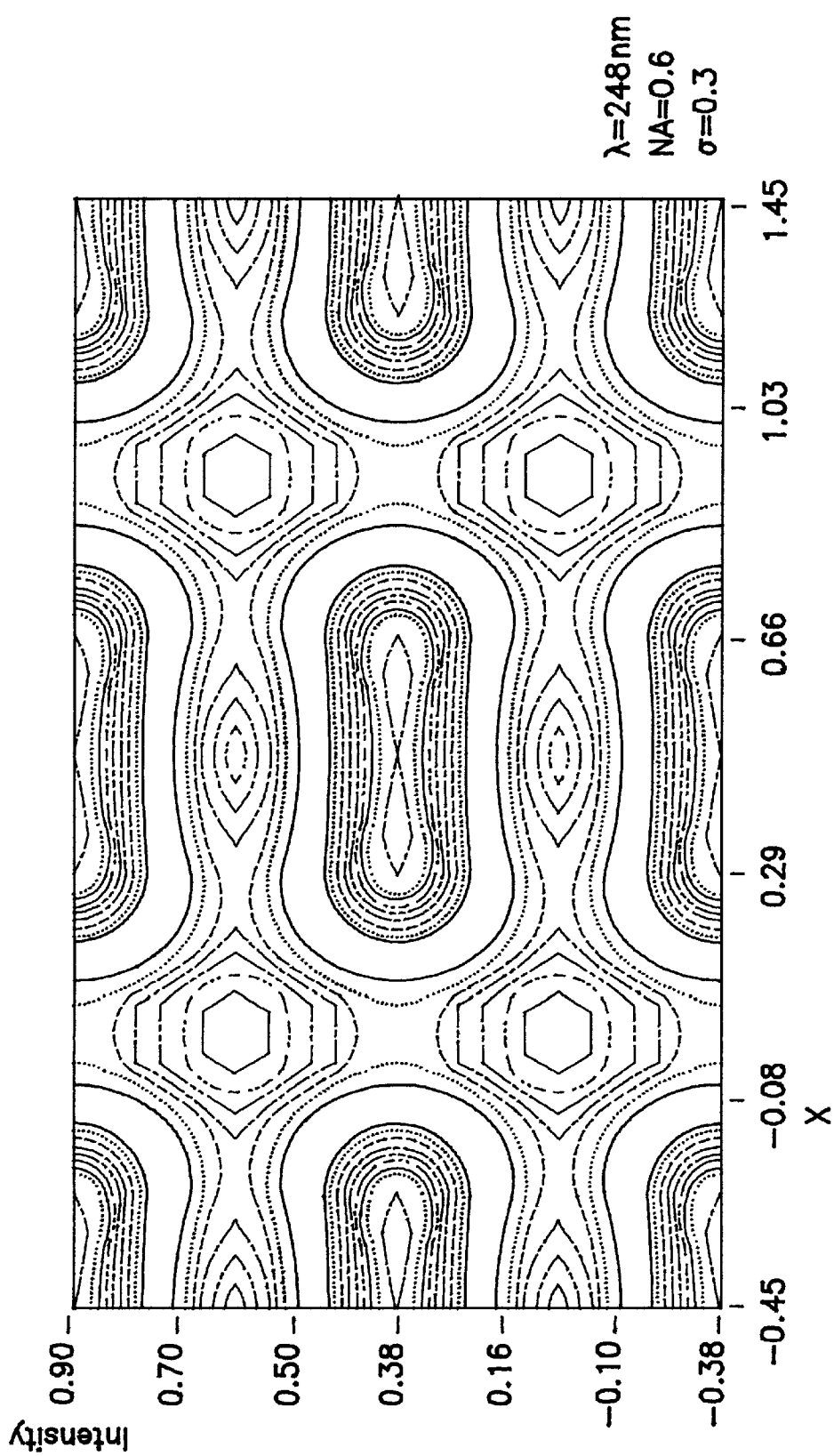
FIG. 6 is a view illustrative of a pattern of distribution of optical intensity on a photo-resist surface when a phase shifting mask is used in a second embodiment according to the present invention.

FIG. 6 illustrates the optical intensity distribution which appears on the photo-resist mask when the phase shifting reticule as a mask, wherein a light source for emitting a KrF laser having a wavelength of 248 nanometers is used. The used phase shifting mask is a mask having a size of 0.7 micrometers×0.35 micrometers and being provided with a phase shifting film having a width of 0.25 micrometers. The phase shifting film is provided on a region B and no phase shifting film is provided on the remaining region A. The number of openings NA is equal to 0.60. σ=0.3. Under those conditions, the photo-resist film is exposed to the photo-lithography. An exposure value is properly set so that a portion represented by real line is not sensitized. Thus, in subsequent development, of the positive photo-resist the portion represented by the real line remains.

A third embodiment according to the present invention will be described in detail with reference to FIGS. 7A through 7E, wherein a novel method for forming a capacitor cylindrically shaped in each memory cell in 64M-dynamic random access memory.

Figure 7A:
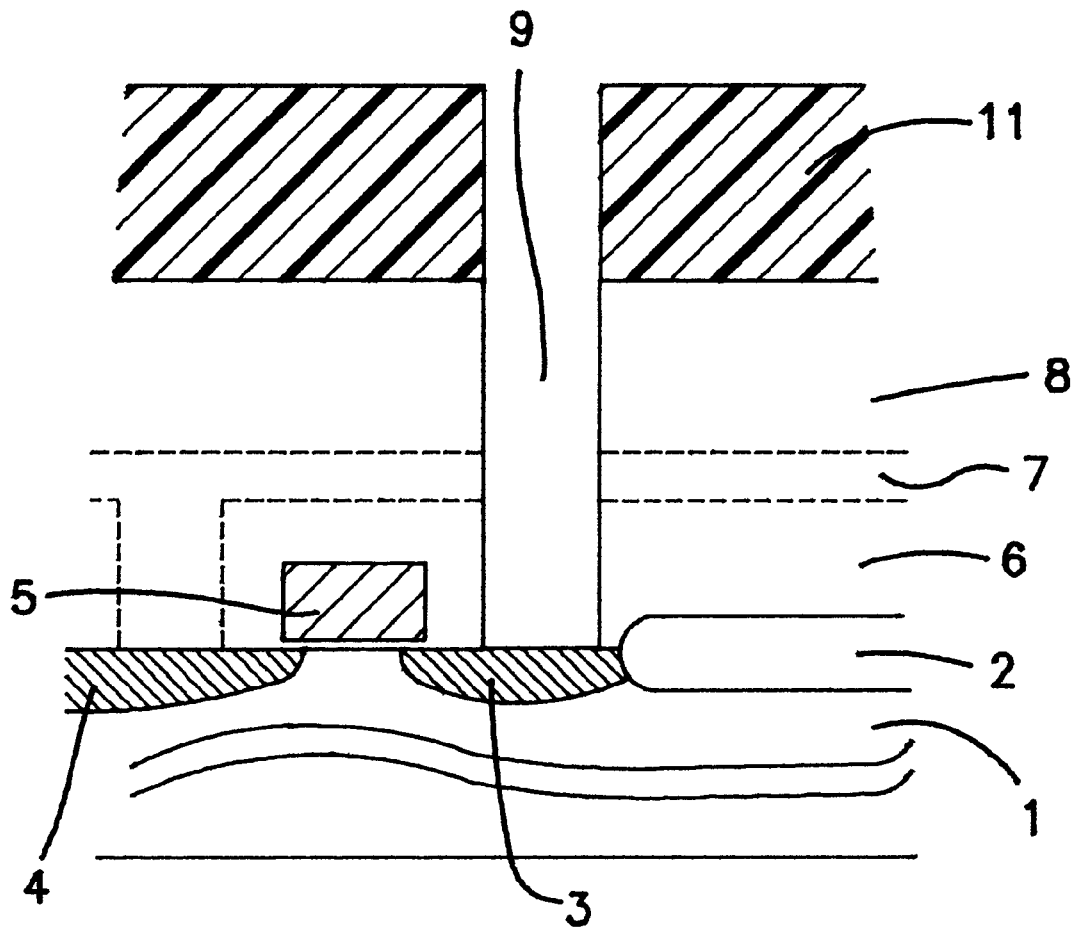
FIGS. 7A through 7E are fragmentary cross sectional elevation views illustrative of memory cell capacitors involved in a novel method for forming the same in a third embodiment according to the present invention.
Figure 7B:
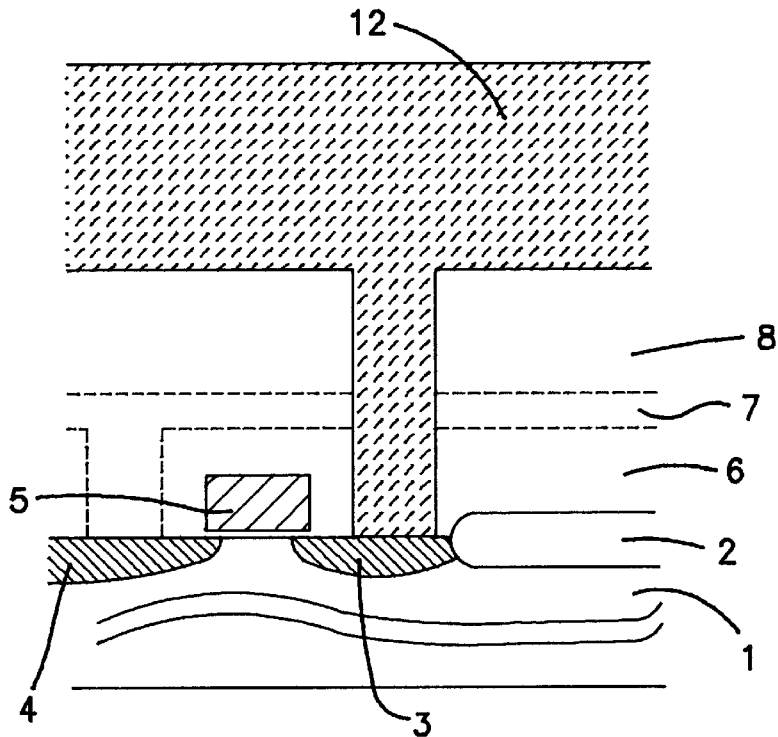
Figure 7C:
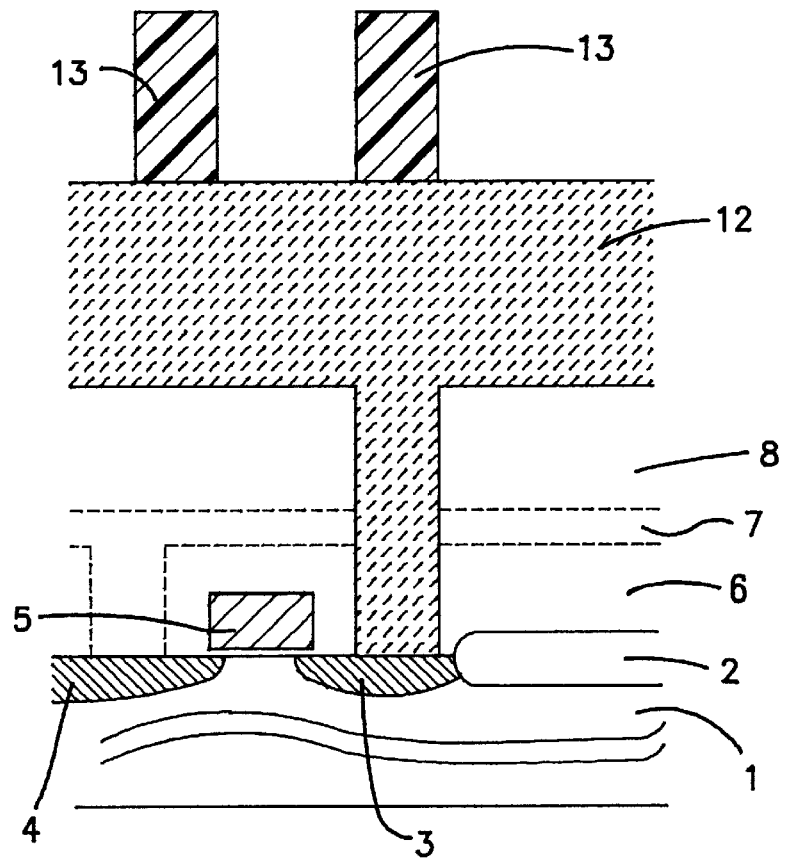

With reference to FIGS. 7A, 7B, the third embodiment is the same described in relation to FIGS. 2A, 2B.

A positive photo-resist is applied on an entire surface of the device and then patterned by a photo-lithography using a phase shifting reticule as a mask.

With reference back to FIG. 7C, the photo-resist applied on the first silicon film 12 is exposed and subsequently developed to form a photo-resist pattern 13 of a vertically extending wall being annular-shaped. The vertically extending wall of the photo-resist pattern 13 being annular-shaped has a part which is positioned over the vertically extending portion of the first silicon film 12. The part of the vertically extending wall has an outer vertical surface which is positioned outside the peripheral end of the vertically extending portion of the first silicon film 12. The part of the vertically extending wall also has an inner vertical surface which is positioned inside the inner end of the vertically extending portion of the first silicon film 12.

Figure 7D:
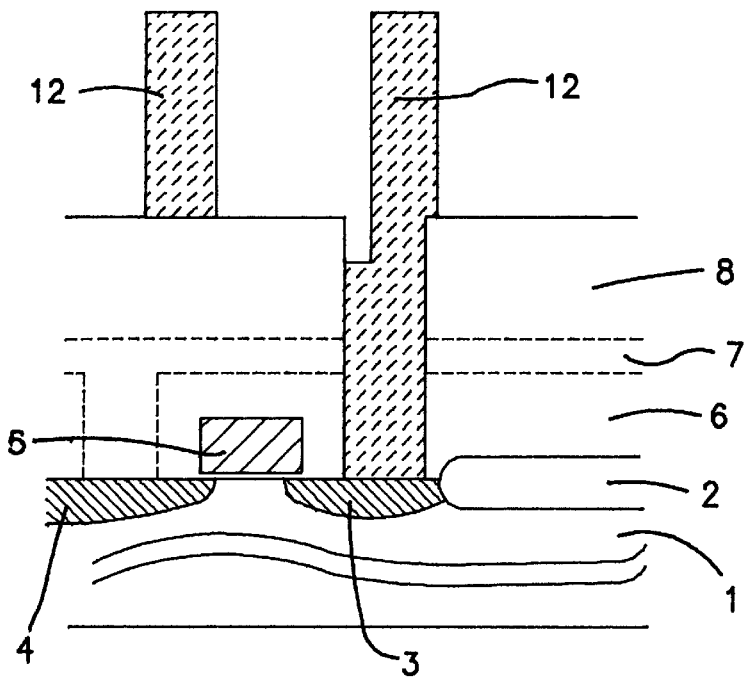

With reference to FIG. 7D, the photo-resist pattern 13 is used as a mask to an etching, for example, an anisotropic etching to selectively remove the first silicon film 12 to thereby form a bottom electrode comprises a vertically extending pillar portion within the vertical hole portion of the contact hole 9 and a vertically extending portion being annular-shaped under the photo-resist pattern 13. Of the bottom electrode 12, the vertically extending portion being annular-shaped has an outer vertical surface which is positioned outside the peripheral end of the vertically extending portion of the first silicon film 12. The vertically extending portion being annular-shaped also has an inner vertical surface which is positioned inside the inner end of the vertically extending portion of the first silicon film 12.

Thereafter, the photo-resist pattern 13 is removed. A spontaneous oxide film coating surfaces of the bottom electrode 12 is removed using a diluted fluorine acid solution. In order to prevent any further spontaneous oxide film from being again formed, a rapid thermal nitriding at a temperature in the range of 850° C. to 900° C. in an ammonia atmosphere for a time in the range of 30 seconds to 60 seconds.

Figure 7E:
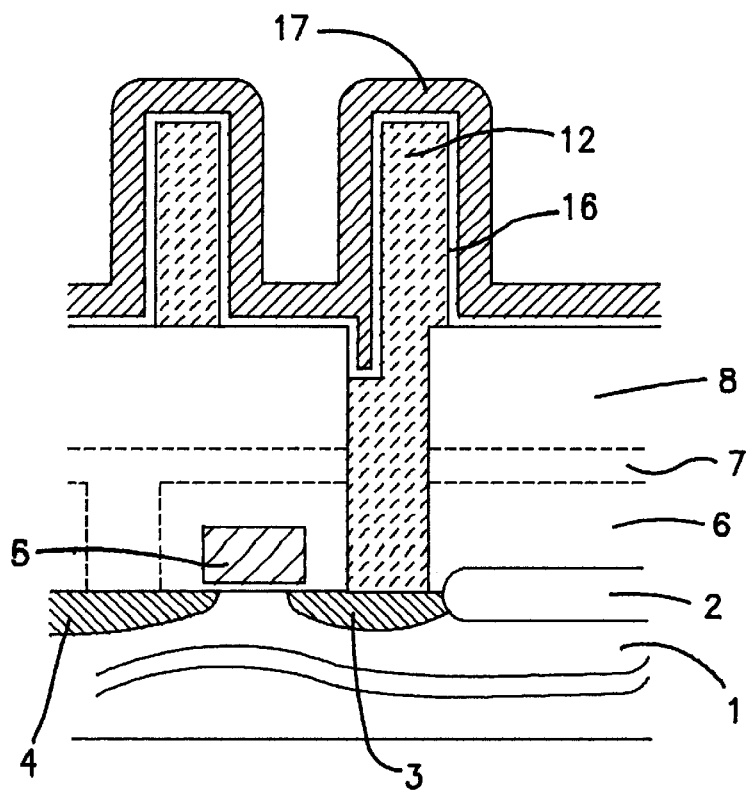

With reference to FIG. 7E, a silicon nitride film having a thickness in the range of 5 nanometers to 7 nanometers is grown, which extends on an entire surface of the bottom electrode 12 and on the second inter-layer insulator 8. The silicon nitride film is subjected to a pyrogenic oxidation in a steam atmosphere at a temperature in the range of 800° C. to 900° C. for ten minutes to 30 minutes to thereby from an $SiO_2/Si_3N_4$ dielectric film 16 which extends on an entire surface of the bottom electrode 12 and on the top surface of the second inter-layer insulator 8. A second silicon film 17 having a thickness of 150 nanometers is deposited on an entire surface of the $SiO_2/Si_3N_4$ dielectric film 16 by a low pressure chemical vapor deposition method. Phosphorus is introduced into the second silicon film 17 by a thermal diffusion at a temperature of 850° C. for a time in the range of ten minutes to fifteen minutes to form a top electrode 17. As a result, the Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A method for forming an annular-shaped and vertically extending bottom electrode of a memory cell capacitor, comprising the steps of:

forming a hole in a photo-resist on an interlayer insulator, which is over a source/drain region in a semiconductor substrate, the hole extending through the photo-resist to the interlayer insulator and being in correspondence with the source/drain region;

isotropically wet etching to form a bowl-shaped concavity in the interlayer insulator that is centered on the hole, the concavity having a peripheral edge that extends beneath the photo-resist to a first diameter;

anisotropically etching through the hole to extend the hole to the semiconductor substrate to expose the source/drain region;

replacing the photo-resist with a conductive film that also fills the concavity and the hole to contact the source/drain region;

placing a phase shifting mask over a positive-working photo-resist film on the conductive film, wherein said phase shifting mask comprises a transparent plate-shaped body with a transparent phase inversion film having a second diameter smaller than the first diameter formed on said transparent plate-shaped body over a central portion of the concavity;

irradiating light through said phase shifting mask onto a surface of said positive-working photo-resist film, wherein a first portion of the light that is transmitted through both said transparent plate-shaped body and said transparent phase inversion film is inverted in phase compared to a second portion of the light that is transmitted through said transparent plate-shaped body only, so that said first and second portions are irradiated on first and second regions of said positive-working photo-resist film respectively, wherein dark parts appear at boundaries between said first and second regions of said positive-working photo-resist film due to cancellation of said first and second portions at said boundaries, to form an annular-shaped positive-working photo-resist pattern that extends vertically over said conductive film and over the periphery of the concavity;

subjecting said conductive film to an anisotropic etching in which said annular-shaped and vertically extending positive-working photo-resist pattern is used as a mask to form an annular-shaped and vertically extending bottom electrode under said annular-shaped and vertically extending photo-resist pattern, the bottom electrode including the conductive film in the concavity having its periphery contacting an annular-shaped and vertically extended portion of the conductive film; and removing said annular-shaped and vertically extending positive-working photo-resist pattern.

2. The method as claimed in claim 1, wherein said annular-shaped and vertically extending photo-resist pattern is a cylinder shape.

3. The method as claimed in claim 1, wherein said conductive film comprises a silicon film doped with an impurity.

4. The method as claimed in claim 1, wherein said irradiating light has a wavelength of 365 nanometers and wherein said phase shifting mask has a size of 1.3 micrometers×0.5 micrometers and said phase inversion film has a width of 0.35 micrometers.

5. The method as claimed in claim 1, wherein said irradiating light has a wavelength of 248 nanometers and wherein said phase shifting mask has a size of 0.7 micrometers×0.35 micrometers and said phase inversion film has a width of 0.25 micrometers.

6. A method for forming an annular-shaped and vertically extending bottom electrode of a memory cell capacitor, comprising the steps of:

forming a hole in a photo-resist on an interlayer insulator which is over a source/drain region in a semiconductor substrate, the hole extending through the photo-resist and the interlayer insulator to the semiconductor substrate to expose the source/drain region;

replacing the photo-resist with a conductive film that also fills the hole to contact the source/drain region;

placing a phase shifting mask over a positive-working photo-resist film on the conductive film, wherein said phase shifting mask comprises a transparent plate-shaped body with a transparent phase inversion selectively film formed on a predetermined region of said transparent plate-shaped body, a portion of an edge of the phase inversion film being over the hole;

irradiating light through said phase shifting mask onto a surface of said positive-working photo-resist film, wherein a first portion of the light that is transmitted through both said transparent plate-shaped body and said transparent phase inversion film is inverted in phase compared to a second portion of the light that is transmitted through said transparent plate-shaped body only, so that said first and second portions are irradiated on first and second regions of said positive-working photo-resist film respectively, wherein dark parts appear at boundaries between said first and second regions of said positive-working photo-resist film due to cancellation of said first and second portions at said boundaries, to form an annular-shaped positive-working photo-resist pattern that extends vertically over said conductive film and which has a portion that extends over the hole;

subjecting said conductive film to an anisotropic etching in which said annular-shaped and vertically extending positive-working photo-resist pattern is used as a mask to form an annular-shaped and vertically extending bottom electrode under said annular-shaped and vertically extending photo-resist pattern, the bottom electrode including the conductive film in the hole contacting an annular-shaped and vertically extended portion of the conductive film; and removing said annular-shaped and vertically extending positive-working photo-resist pattern.

7. The method of claim 6, wherein an interior edge of the annular-shaped and vertically extended portion of the conductive film is substantially aligned with a center of the hole.

8. The method of claim 6, wherein a portion of the conductive film in the hole that is not beneath the annular-shaped and vertically extended portion of the conductive film, is recessed relative to a surface of the interlayer insulator.

* * * * *